(12) United States Patent
Seo et al.

(10) Patent No.: US 9,837,361 B2
(45) Date of Patent: Dec. 5, 2017

(54) SEMICONDUCTOR PACKAGE WITH ELECTROMAGNETIC SHIELDING MEMBER

(71) Applicant: Samsung Electronics Co., Ltd., Suwon-si, Gyeonggi-do (KR)

(72) Inventors: Byoung-rim Seo, Hwaseong-si (KR); Woon-bae Kim, Seoul (KR); Young-doo Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 5 days.

(21) Appl. No.: 14/874,609

(22) Filed: Oct. 5, 2015

(65) Prior Publication Data

US 2016/0111376 A1  Apr. 21, 2016

(30) Foreign Application Priority Data

Oct. 20, 2014 (KR) .......................... 10-2014-0141692

(51) Int. Cl.
*H01L 23/52* (2006.01)
*H01L 21/70* (2006.01)
(Continued)

(52) U.S. Cl.
CPC ............ *H01L 23/552* (2013.01); *H01L 24/05* (2013.01); *H01L 23/3114* (2013.01);
(Continued)

(58) Field of Classification Search
CPC .......... H01L 2224/96; H01L 2224/131; H01L 2224/13147; H01L 2224/03; H01L 2224/11; H01L 2224/02372; H01L 2224/04105; H01L 2224/05025; H01L 2224/12105; H01L 2224/13024; H01L 2224/34; H01L 2924/00014; H01L 2924/014; H01L 2924/3025; H01L 23/3114; H01L 23/3128; H01L 23/552; H01L 23/60; H01L 23/5225; H01L 24/02; H01L 24/05; H01L 24/13; H01L 24/34; H01L 29/41; H01L 2029/41; H01L 2224/0555; H01L 2224/05551; H01L 2224/80345; H01L 2224/80385;
(Continued)

(56) References Cited

U.S. PATENT DOCUMENTS

| | | | | |
|---|---|---|---|---|
| 6,235,985 B1 * | 5/2001 | Dai | ...................... | H05K 1/0218 174/359 |
| 6,838,748 B2 * | 1/2005 | Ishio | ................... | H01L 23/3114 257/659 |

(Continued)

FOREIGN PATENT DOCUMENTS

KR          10-1247343 B1       3/2013

*Primary Examiner* — Teresa M Arroyo
(74) *Attorney, Agent, or Firm* — Harness, Dickey & Pierce, P.L.C.

(57) ABSTRACT

A semiconductor package including a semiconductor chip having an active surface and a non-active surface opposite to the active surface, a ground member disposed on the active surface of the semiconductor chip, and an electromagnetic shielding member passing through the semiconductor chip, electrically connected to the ground member, and covering at least some regions of the non-active surface of the semiconductor chip may be provided.

19 Claims, 10 Drawing Sheets

(51) Int. Cl.
*H01L 23/552* (2006.01)
*H01L 23/00* (2006.01)
*H01L 23/31* (2006.01)
*H01L 23/522* (2006.01)
*H01L 23/60* (2006.01)
*H05K 1/02* (2006.01)

(52) U.S. Cl.
CPC ...... *H01L 23/3128* (2013.01); *H01L 23/5225* (2013.01); *H01L 23/60* (2013.01); *H01L 24/02* (2013.01); *H01L 24/13* (2013.01); *H01L 2224/02372* (2013.01); *H01L 2224/04105* (2013.01); *H01L 2224/05025* (2013.01); *H01L 2224/12105* (2013.01); *H01L 2224/131* (2013.01); *H01L 2224/13024* (2013.01); *H01L 2224/13147* (2013.01); *H01L 2224/80345* (2013.01); *H01L 2224/96* (2013.01); *H01L 2225/06537* (2013.01); *H01L 2924/3025* (2013.01); *H05K 1/0218* (2013.01)

(58) Field of Classification Search
CPC .......... H05K 1/0218; H05K 1/02; H05K 9/00; H05K 9/0026; A61K 2039/55505; A61K 2039/55511; A61K 39/07; A61K 39/12; A61K 39/145; A61K 39/39; A61K 47/26; A61K 9/19; C12N 2760/16034; C12N 7/00
USPC .......................................... 257/503, 808, 659
See application file for complete search history.

(56) References Cited

U.S. PATENT DOCUMENTS

| | | |
|---|---|---|
| 7,618,846 B1 * | 11/2009 | Pagaila ................. H01L 21/568 257/E21.599 |
| 7,687,283 B2 | 3/2010 | Terui |
| 7,687,895 B2 | 3/2010 | Brunnbauer et al. |
| 7,989,928 B2 | 8/2011 | Liao et al. |
| 8,043,896 B2 | 10/2011 | Lee et al. |
| 8,085,545 B2 | 12/2011 | Song |
| 8,169,063 B2 | 5/2012 | Otremba et al. |
| 8,183,130 B2 | 5/2012 | Lee et al. |
| 8,368,185 B2 | 2/2013 | Lee et al. |
| 8,426,947 B2 | 4/2013 | Sasaki et al. |
| 8,643,168 B1 * | 2/2014 | Wong ................... H03M 1/001 257/700 |
| 2010/0078778 A1 * | 4/2010 | Barth .................... H01L 21/568 257/659 |
| 2011/0175225 A1 | 7/2011 | Seddon et al. |
| 2012/0241209 A1 | 9/2012 | Wu |
| 2012/0258594 A1 * | 10/2012 | Barth ............... H01L 21/76898 438/667 |
| 2013/0134601 A1 * | 5/2013 | Cheng ............. H01L 21/76898 257/774 |
| 2014/0231972 A1 * | 8/2014 | Hsu ...................... H01L 23/552 257/659 |
| 2015/0084158 A1 * | 3/2015 | Tsai ....................... H01L 28/10 257/531 |

\* cited by examiner

SEMICONDUCTOR PACKAGE WITH ELECTROMAGNETIC SHIELDING MEMBER

CROSS-REFERENCE TO RELATED APPLICATION

This application claims priority to Korean Patent Application No. 10-2014-0141692, filed on Oct. 20, 2014 in the Korean Intellectual Property Office, the disclosure of which is incorporated herein in its entirety by reference.

BACKGROUND

The inventive concepts relate to semiconductor packages, and more particularly, to semiconductor packages including an electromagnetic shielding member.

In the electronic product markets, a demand for a portable device is rapidly increasing. Thus, there is a continuing demand for reducing size and/or weight of electronic components to be included in the portable device. To reduce the size and weight of electronic components, technologies for reducing the sizes of individual electronic components to be included in the portable device and a semiconductor package technology for integrating individual components into a single package are being desired. For example, a semiconductor package, which processes a radio frequency signal, may be desired to have various electromagnetic shielding structures so as to achieve a more compact arrangement of electronic components on, for example, the portable device, and suppress issues associated with electromagnetic interference characteristics or electromagnetic susceptibility characteristics.

SUMMARY

Some of the inventive concepts provide semiconductor packages including an electromagnetic shielding structure having improved electromagnetic interference characteristics and/or that can be manufactured with relative ease.

According to an example embodiment, a semiconductor package includes a semiconductor chip having an active surface and a non-active surface opposite to the active surface, a ground member on the active surface of the semiconductor chip, and an electromagnetic shielding member passing through the semiconductor chip, electrically connected to the ground member, and covering at least some regions of the non-active surface of the semiconductor chip.

Portions of the electromagnetic shielding member passing through the semiconductor chip may be connected together to have a shape in a form of a number sign (#) in the semiconductor chip.

Portions of the electromagnetic shielding members in the semiconductor chip may have a pillar shape.

The electromagnetic shielding member may entirely cover the non-active surface of the semiconductor chip.

A side surface of the semiconductor chip may be exposed to an outside.

The ground member may be exposed through the non-active surface and connected to the electromagnetic shielding member.

The semiconductor package may further include a redistribution layer on the active surface of the semiconductor chip, and a connection member electrically connected to the redistribution layer.

The semiconductor package may further include a molding member covering the electromagnetic shielding member and a side surface of the semiconductor chip.

The semiconductor package may further include a redistribution layer on a surface of the molding member, through which the active surface of the semiconductor chip is exposed, and a connection member electrically connected to the redistribution layer.

The connection member may include a solder ball.

According to an example embodiment, a semiconductor package includes a semiconductor chip having an active surface and a non-active surface opposite to the active surface, a ground member spaced apart from an edge of the active surface of the semiconductor chip, a penetration hole passing through the semiconductor chip exposing the ground member, a first electromagnetic shielding member filling at least some portion of the penetration hole and electrically connected to the ground member, and a second electromagnetic shielding member connected to the first electromagnetic shielding member and covering at least some portion of the non-active surface of the semiconductor chip.

The second electromagnetic shielding member may entirely cover the non-active surface of the semiconductor chip.

The first electromagnetic shielding member may be spaced apart from a side surface of the semiconductor chip.

The first electromagnetic shielding member may have a shape in a form of a number sign (#) in the semiconductor chip.

The first electromagnetic shielding member may include a plurality of pillar shape structures in the semiconductor chip.

According to an example embodiment, a semiconductor package includes a semiconductor chip having an active surface and a non-active surface opposite to the active surface, a ground member at an edge of the semiconductor chip, a trench formed from the non-contact surface of the semiconductor chip to expose the ground member therethrough, an electromagnetic shielding member filling the trench and covering at least some regions of the non-active surface of the semiconductor chip, a redistribution layer on the active surface of the semiconductor chip, and a connection member electrically connected to the redistribution layer.

Portions of the electromagnetic shielding member filling the trench may be connected together to have a sharp (#) shape in the semiconductor chip.

Portions of the electromagnetic shielding members filling the trench, may be disposed in the semiconductor chip in a pillar shape.

The ground member and the redistribution layer may not be electrically connected to each other.

The connection member may include a solder ball.

According to an example embodiment, a semiconductor package include a semiconductor chip having an active surface and a non-active surface opposite to the active surface, at least one ground member on the active surface, and an electromagnetic shielding structure connected to the at least one ground member, the electromagnetic shielding structure including a plurality of pillar shape electromagnetic shielding members, the plurality of pillar shape electromagnetic shielding members passing through the semiconductor chip while being proximate to a side surface of the semiconductor chip.

When seeing from above, the electromagnetic shielding structure may have a shape in a form of a number sign (#) connecting the plurality of pillar shape electromagnetic shielding members together.

The electromagnetic shielding structure may further include a member, which covers at least some portion of the non-active surface of the semiconductor chip and connected to some of the plurality of pillar shape electromagnetic shielding members The at least one ground member may have a recess defined therein and configured to receive one or more of the plurality of pillar shape electromagnetic shielding members.

The at least one ground member may have a recess to receive a portion of one of the plurality of pillar shape electromagnetic shielding members.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION

The inventive concepts may, however, be embodied in many different forms and should not be construed as being limited to the example embodiments set forth herein; rather, these example embodiments are provided so that this disclosure will be thorough and complete, and will fully convey the inventive concepts to those of ordinary skill in the art. It should be understood, however, that there is no intent to limit the inventive concepts to the particular forms disclosed, but on the contrary, the inventive concepts are to cover all modifications, equivalents, and alternatives falling within the spirit and scope of the inventive concepts. Like reference numerals denote like elements throughout the specification and drawings. In the drawings, the dimensions of structures are exaggerated for clarity of the inventive concepts. As used herein, the term "and/or" includes any and all combinations of one or more of the associated listed items.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example team "below" can encompass both an orientation of above and below. The device may be otherwise oriented (rotated 90 degrees or at other orientations) and the spatially relative descriptors used herein interpreted accordingly.

Also, though terms "first" and "second" are used to describe various members, components, regions, layers, and/or portions in various example embodiments of the inventive concepts, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

The terminology used herein is for the purpose of describing particular example embodiments only and is not intended to be limiting of the inventive concepts. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Unless otherwise defined, all terms used herein, including technical and scientific terms, have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Unless otherwise defined, a vertical direction or a horizontal direction refers to a vertical direction or a horizontal direction with respect to a principal surface of a package substrate. In addition, unless otherwise defined, a top surface of a component stacked on the package substrate is a surface opposite to the package substrate, and a bottom surface thereof is a surface facing the package substrate.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, some example embodiments of the inventive concepts will be described in detail with reference to the accompanying drawings.

Figure 1:
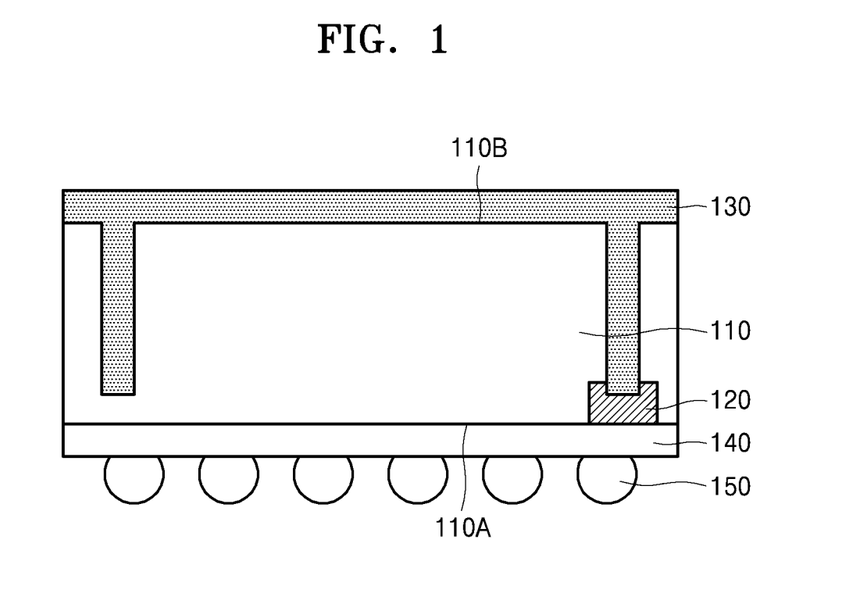
FIG. 1 is a cross-sectional view of a semiconductor package according to an example embodiment.

FIG. 1 is a cross-sectional view of a semiconductor package according to an example embodiment.

Referring to FIG. 1, the semiconductor package may include a ground member 120 on an active surface 110A (on which a semiconductor device is to be formed) of a semiconductor chip 110 and an electromagnetic shielding member 130 electrically connected to the ground member 120.

The semiconductor chip 110 may include a body part, a wiring part, and a protection part. The semiconductor chip 110 may be formed based on an active wafer.

When the semiconductor chip 110 is formed based on an active wafer, the body part may include a semiconductor substrate, an integrated circuit layer, and an interlayer insulating film. A wiring part, which is disposed on the body part, may include an inter-metal insulating layer and a multilayer wiring formed within the interlayer insulating layer.

Examples of the semiconductor substrate, which is a base of the body part, may include a group IV material wafer (e.g., a silicon wafer), or a group III-V compound wafer. The semiconductor substrate may be made of a single crystalline wafer (e.g., a single crystalline silicon wafer) according to some example embodiments. However, the semiconductor substrate is not limited to a single crystalline wafer. An epitaxial wafer, a polished wafer, an annealed wafer, a silicon-on-insulator (SOI) wafer, or the like may be used as the semiconductor substrate. The epitaxial wafer means a wafer in which a crystalline material is grown on a single crystalline silicon substrate.

The protection part may cover the wiring part. The protection part may protect the semiconductor chip from external physical and/or chemical damage.

The semiconductor chip 110 may include a memory device or a non-memory device. Examples of the memory device may include dynamic random access memory (DRAM), static random access memory (SRAM), a flash memory, electrically erasable and programmable read only memory (EEPROM), phase-change random access memory (PRAM), magnetoresistive random access memory (MRAM), and resistive random access memory (RRAM). Examples of the non-memory device may include logic devices, for example, a microprocessor, a digital signal processor, and a microcontroller, or other similar devices.

In a case where the semiconductor package, including the semiconductor chip 110, is mounted on an electronic device having, for example, a main board, an electromagnetic wave emitted from the semiconductor package may cause electromagnetic interference (EMI) in other electronic components mounted on the electronic device. Thus, for example, electromagnetic noise or malfunctions may occur in the electronic device including the semiconductor package mounted thereon, thereby deteriorating reliability of the electronic device. In the case of a recently developed semiconductor package having relatively fast response speeds and relatively high capacity, EMI related issue(s) caused by electromagnetic emission is(are) getting serious. An electromagnetic wave is inevitably generated during the operation of the semiconductor package. The electromagnetic shielding member 130 is provided so as to mitigate or prevent the electromagnetic wave from affecting an outside of the semiconductor package in an electronic device.

In order to enhance the electromagnetic shielding effect, the electromagnetic shielding member 130 may be electrically connected to the ground member 120. Through such a process, the electromagnetic shielding member 130 may be grounded to the outside. The ground member 120 may be present at some regions of the semiconductor chip 110, or may be present at all regions where the electromagnetic shielding member 130 passes through the semiconductor chip 110.

In the semiconductor package process, individual semiconductor packages are produced by dicing semiconductor chips of a semiconductor wafer, and an electromagnetic shielding layer is formed by depositing a metal material on the top and side surfaces of the semiconductor packages by, for example, plating, etc. In the case that an interval between the electromagnetic shielding layer, which surrounds the side surface of the semiconductor package, and an external connection terminal of the semiconductor package, for example, a solder ball, is only several micrometers apart, a short circuit may occur between the electromagnetic shielding layer and the external connection terminal. In the case that an electromagnetic shielding layer is formed at the outside of the semiconductor package, coating failure may occur in the electromagnetic shielding layer due to non-uniformity of a plane cut during a semiconductor package cutting process. Therefore, according to some example embodiments, the electromagnetic shielding member 130 may be provided inside the semiconductor chip 110 from the side surfaces thereof, instead of surrounding the side surface of the semiconductor package.

In the semiconductor package process, a process of forming electromagnetic shielding layers on the individual semiconductor chips may be performed after dicing the semiconductor chips of the semiconductor wafer. However, according to some example embodiments, the electromagnetic shielding member 130 may be formed at a semiconductor wafer level, thereby simplifying a manufacturing process and/or reducing a manufacturing cost.

A wiring, which electrically connects the semiconductor device to the external connection terminal, may be formed on the active surface 110A of the semiconductor chip 110. The wiring may electrically connect components provided on the active surface 110A of the semiconductor chip 110 to the outside. The wiring may be provided in a redistribution layer 140. The redistribution layer 140 may include, for example, a wiring and an insulating film. The redistribution layer 140 may be formed at a semiconductor wafer level.

A connection member 150 may be electrically connected to the wiring formed in the redistribution layer 140. The connection member 150 may transfer an electric signal to the outside when the semiconductor chip 110 is attached to a package substrate, for example, a printed circuit board (PCB), a ceramic substrate, a glass substrate, or an interposer substrate.

The connection member 150 may be made of a solder ball. A plurality of connection members 150 may be electrically connected to the redistribution layer 140 formed on the active surface 110A of the semiconductor chip 110, and pads may be respectively disposed with respect to the connection members 150. The connection member 150 may include a copper pillar, or may include a combination of a copper pillar and a solder.

FIG. 1 illustrates that only the connection member 150 is formed on the active surface 110A of the semiconductor chip 110, but this is only for simplicity of illustration of the cross-section and convenience of understanding. In practice, various types of pads may be disposed between the connection member 150 and on the active surface 110A of the semiconductor chip 110.

Figure 2:
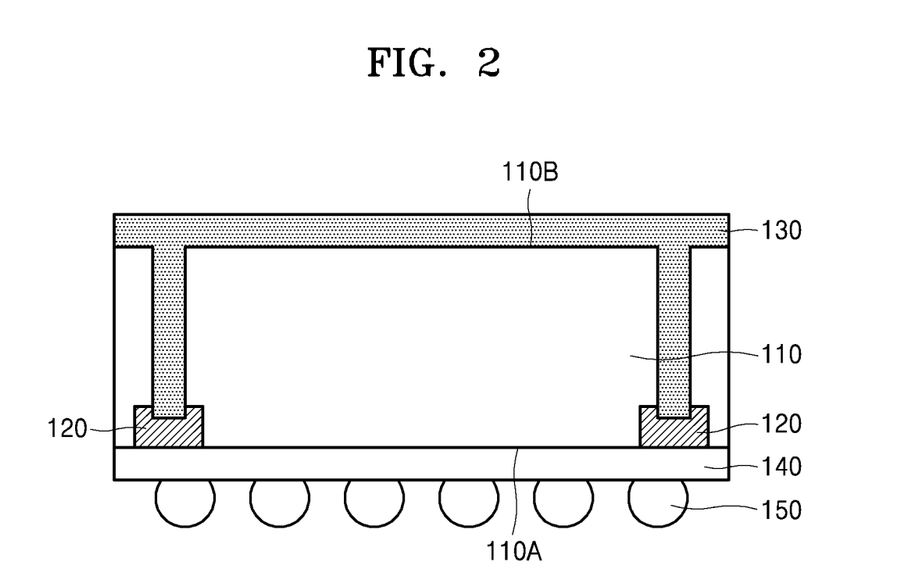
FIG. 2 is a cross-sectional view of a semiconductor package according to an example embodiment.

FIG. 2 is a cross-sectional view of a semiconductor package according to an example embodiment.

Referring to FIG. 2, in a semiconductor device manufacturing method, a ground member 120 may be formed at an edge of a semiconductor chip 110.

The ground member 120 may be formed in a similar manner to a metal wiring forming process of a semiconductor device manufacturing method. The ground member 120 may be formed by etching a semiconductor wafer to a predetermined depth and depositing a conductive material in the etched region.

The ground member 120 may be present at some regions of the active surface 110A of the semiconductor chip 110, and may be formed to have a shape in a form of a number sign (or alternatively, referred to as a hash tag or a pound sign) (#) to cover front, rear, left, and right portions of the side surface of the semiconductor chip 110. In a case where the ground member 120 is formed to have the shape in the form of the number sign (#) on the front, rear, left, and right portions of the side surface of the semiconductor chip 110, an electromagnetic wave, which may be emitted from the side surface of the semiconductor chip 110, may be shielded by the electromagnetic shielding member 130 in a completely surrounded manner.

In a case where the ground members 120 are formed at various locations on the active surface 110A of the semiconductor chip 110, a higher electromagnetic shielding effect may be expected because the ground member 120 may shield the electromagnetic wave even when the electromagnetic shielding member 130 does not contact the active surface 110A of the semiconductor chip 110.

Figure 3:
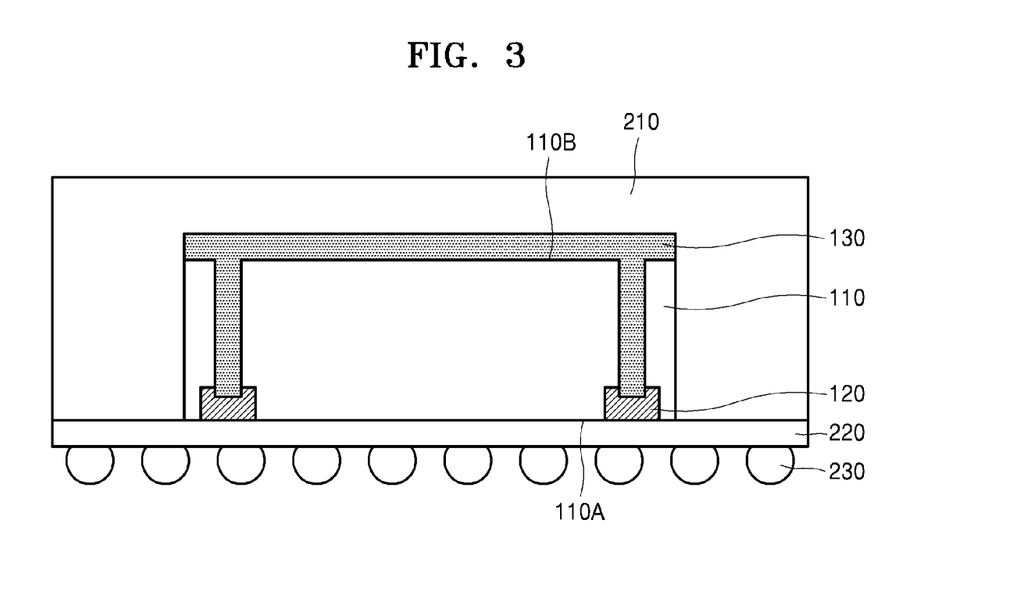
FIG. 3 is a cross-sectional view of a semiconductor package according to an example embodiment.

FIG. 3 is a cross-sectional view of a semiconductor package according to an example embodiment.

Referring to FIG. 3, a molding member 210 may be formed to surround a top surface of an electromagnetic shielding member 130, which covers a side surface of a semiconductor chip 110, and a non-active surface 110B of the semiconductor chip 110.

A semiconductor package may be configured in a form of the semiconductor chip 110 as illustrated in FIGS. 1 and 2, or may be configured such that the molding member 210 surrounds the semiconductor chip 110 as illustrated in FIG. 3.

The semiconductor package according the present example embodiment may be referred to as a fan-out-wafer level package (FO-WLP). In the case of the FO-WLP, the semiconductor chip 110 may be surrounded by the molding member 210, a redistribution layer 220 may be formed on the active surface 110A of the semiconductor chip 110, and a connection member 230 may be formed on the redistribution layer 220. In the case of the FO-WLP, a first group of the connection members 230 may be provided directly under the semiconductor chip 110 and a second group of the connection members 230 may be provided outside the first group of the connection members at a planar location outside the semiconductor chip 110. The second group of the connection members 230 may be connected to the active surface 110A of the semiconductor chip 110 via the redistribution layer 140.

According to some semiconductor package processes, a molding member may be formed and then an electromagnetic shielding layer may be formed on the outer surface of the molding member. However, according to some example embodiments, a short circuit between the electromagnetic shielding member 130 and the connection member 230 of the semiconductor package may be mitigated or prevented by providing the electromagnetic shielding member 130 inside the molding member 210.

In the case of forming the electromagnetic shielding layer on the outer surface of the molding member 210, a coating failure due to the non-uniformity of the plane cut during the cutting process may be mitigated or prevented from occurring in the electromagnetic shielding layer. Further, peeling-off of the coating due to damage on a part of the electromagnetic shielding layer during laser marking may be mitigated or prevented from occurring.

Figure 4:
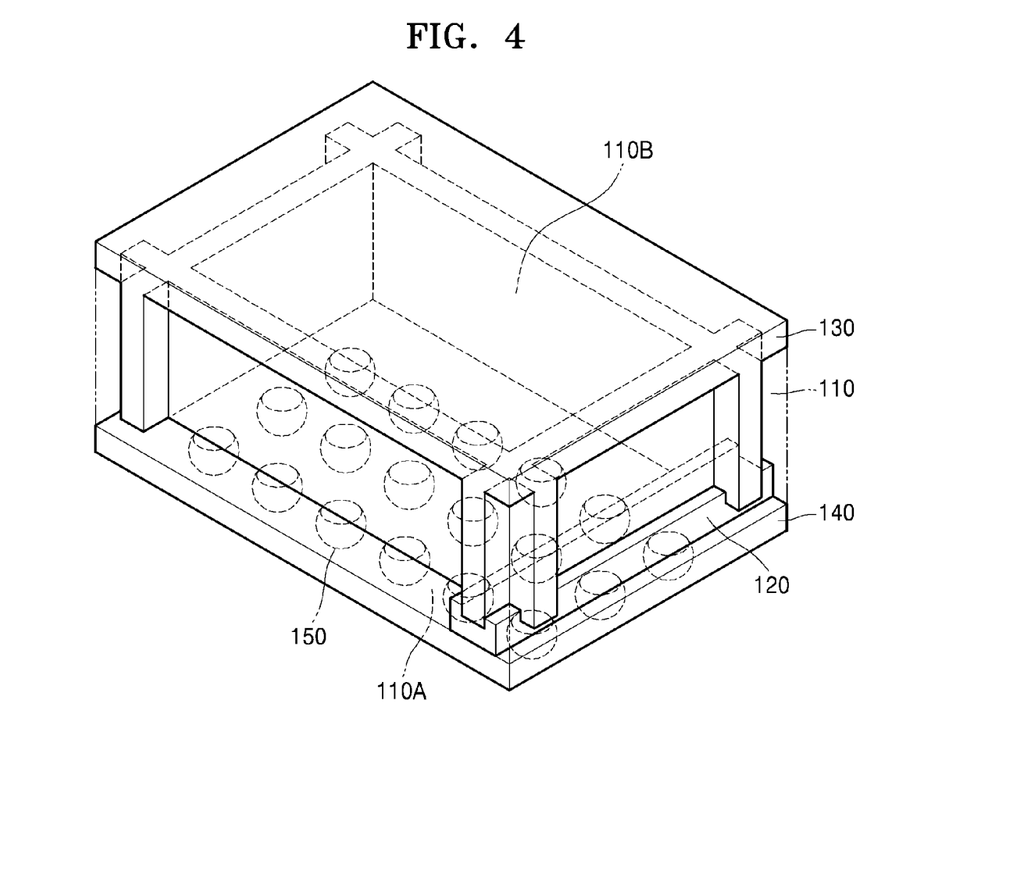
FIG. 4 is a perspective view of a semiconductor package according to an example embodiment.

FIG. 4 is a perspective view of a semiconductor package according to an example embodiment.

Referring to FIG. 4, an electromagnetic shielding member 130 having a sharp (#) shape may be formed in a semiconductor chip 110.

According to this example embodiment, the electromagnetic shielding member 130 may be formed to have a shape in a form of the number sign (or alternatively, referred to as a hash tag or a pound sign) (#) so as to substantially shield the electromagnetic wave emitted from the side surface of the semiconductor chip 110. The structure of the electromagnetic shielding member 130 may be formed by using a relatively difficult process of forming a trench 110H, but may substantially improve electromagnetic shielding performance. As illustrated in FIG. 4, a ground member 120 may contact the electromagnetic shielding member 130 at select locations of the semiconductor chip 110. Although not illustrated, the ground member 120 may be provided to be in contact with an entire bottom surface of the electromagnetic shielding member 130.

Figure 5:
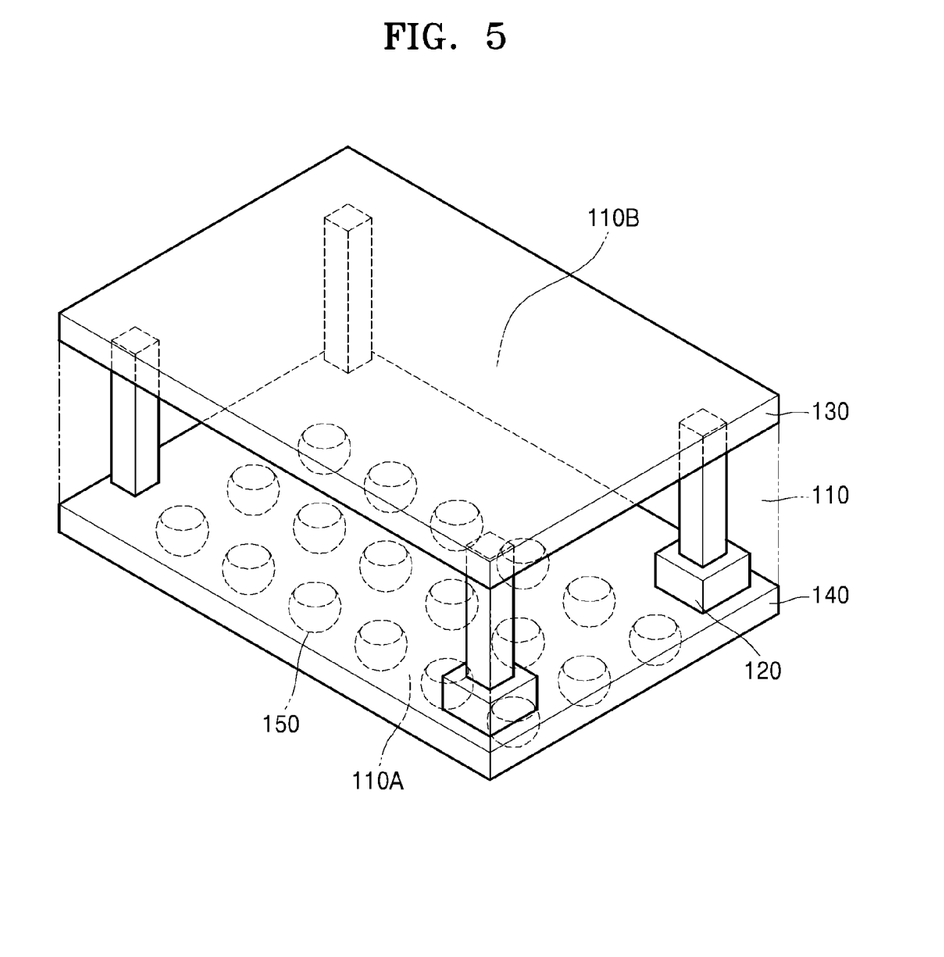
FIG. 5 is a perspective view of a semiconductor package according to an example embodiment.

FIG. 5 is a perspective view of a semiconductor package according to an example embodiment.

Referring to FIG. 5, a plurality of electromagnetic shielding members 130 having a pillar shape may be formed in a semiconductor chip 110.

In order to ground the electromagnetic shielding member 130 formed on the active surface 110A of the semiconductor chip 110, a trench may be formed and may be electrically connected to a ground member. The effect of shielding an electromagnetic wave emitted from the side surface of the semiconductor chip 110 may be lower than the electromagnetic shielding member 130 illustrated in FIG. 5. However, the semiconductor package including the electromagnetic shielding member 130 according to this example embodiment may be formed with a relative ease. As illustrated in FIG. 5, the semiconductor device manufacturing method may form the ground member 120 in select regions on the active surface 110A of the semiconductor chip 110.

Figure 6:
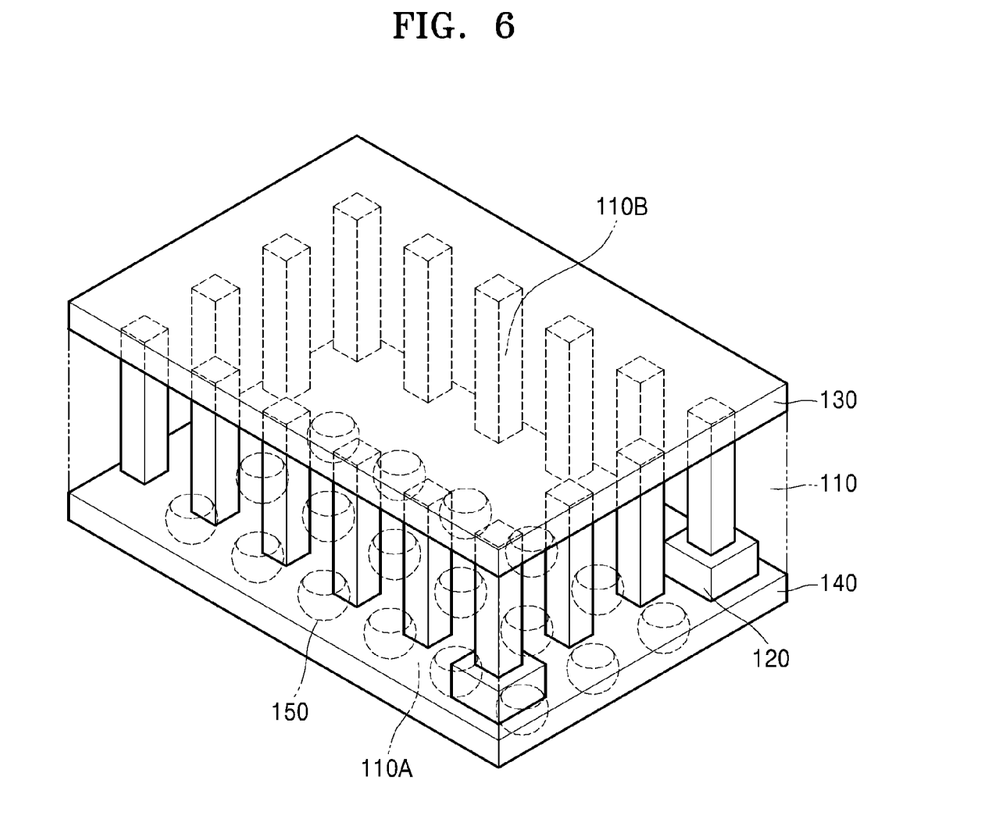
FIG. 6 is a perspective view of a semiconductor package according to an example embodiment.

FIG. 6 is a perspective view of a semiconductor package according to an example embodiment.

Referring to FIG. 6, a plurality of electromagnetic shielding members 130 each having a pillar shape may be formed at narrow intervals in a semiconductor chip 110.

In order to ground the electromagnetic shielding members 130 formed on the active surface 110A of the semiconductor chip 110, a trench may be formed in the ground member 120 to receive the electromagnetic shielding members 130 having the pillar shape such that the electromagnetic shielding members 130 are electrically connected to a ground member 120. According to this example embodiment, the effect of shielding an electromagnetic wave emitted from the side surface of the semiconductor chip 110 may be comparable to the case where entire portions of the side surface of the semiconductor chip 110 are covered, as illustrated in FIG. 4. However, the plurality of pillar-shaped electromagnetic shielding members 130 may be formed with relative ease using a manufacturing process, as illustrated in FIG. 5. According to this example embodiment, the semiconductor device manufacturing method may be performed such that the ground member 120s are formed in select regions of the active surface 110A of the semiconductor chip 110 to provide electrically connection between the ground members 120 and some of the plurality of electromagnetic shielding members 130 at the select regions.

Figure 7:
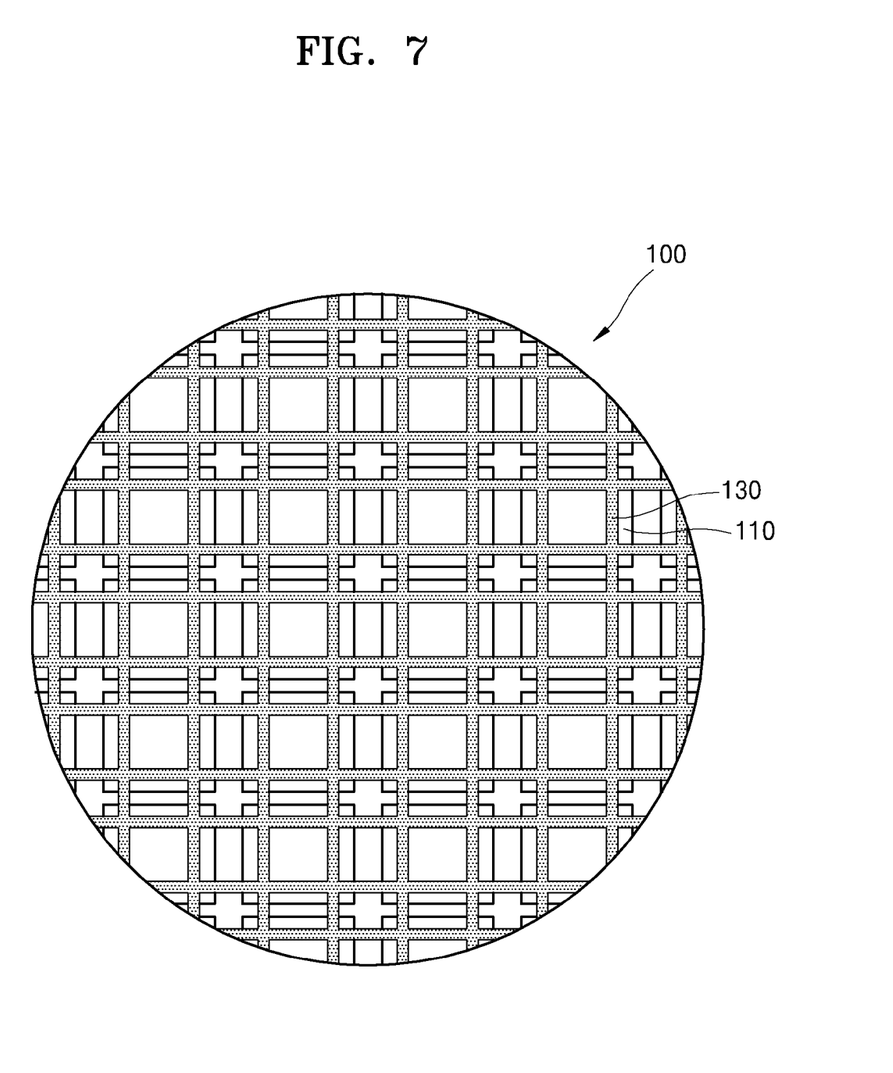
FIG. 7 is a plan view of a semiconductor wafer according to an example embodiment.

FIG. 7 is a plan view of a semiconductor wafer 100 according to an example embodiment.

Referring to FIG. 7, a plurality of semiconductor chips 110 may be disposed in the semiconductor wafer 100.

For better understanding, only electromagnetic shielding members 130 disposed inside the semiconductor chips 110 are illustrated in FIG. 7.

In a wafer level package process of forming a package at a semiconductor wafer level, the electromagnetic shielding members 130 may be formed on the semiconductor wafer 100. According to some example embodiments, in the semiconductor package process, in order to form electromagnetic shielding layers at the outside of a semiconductor package, a process of forming electromagnetic shielding layers of the individual semiconductor chips may be performed after dicing the semiconductor chips of the semiconductor wafer. However, according to this example embodiment, the electromagnetic shielding member 130 is formed at a semiconductor wafer level, and thus a manufacturing process may be simplified and a manufacturing cost may be reduced.

FIGS. 8 to 13 are diagrams for describing a method of manufacturing a semiconductor package, according to an example embodiment.

Figure 8:
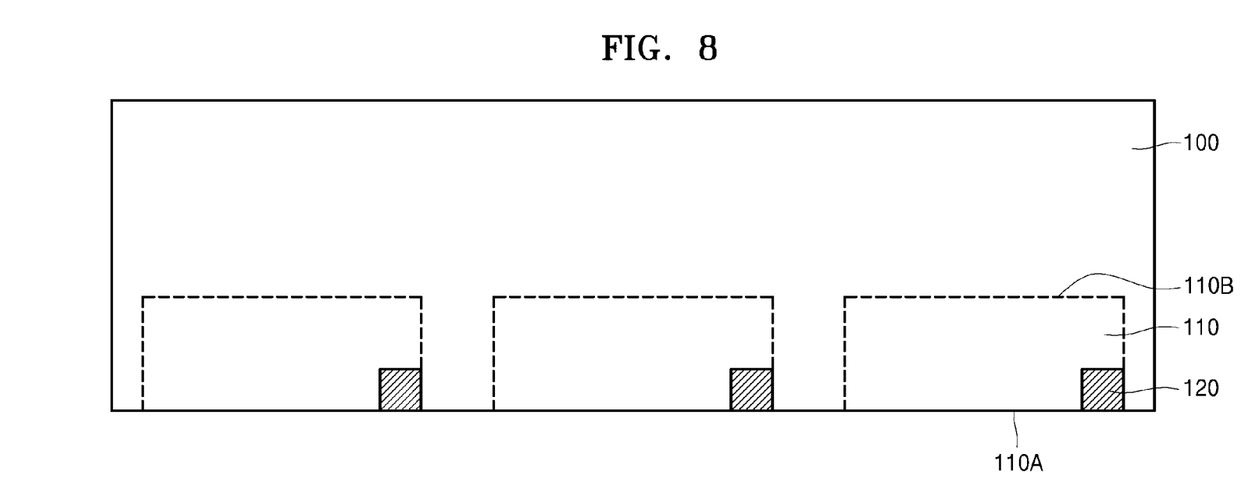
FIGS. 8 to 13 are diagrams for describing a method of manufacturing a semiconductor package, according to an example embodiment.

FIG. 8 illustrates semiconductor chips 110 formed in a semiconductor wafer 100.

The plurality of semiconductor chips 110 may be formed in the semiconductor wafer 100, and scribe lines may be provided between the semiconductor chips 110.

According to the example embodiment, a ground member 120 may be formed at an edge of the semiconductor chip 110. The around member 120 may be formed using a process similar to a metal wiring forming process of a semiconductor device manufacturing method. The ground member 120 may be formed by etching the semiconductor wafer 100 to a desired (or alternatively, predetermined) depth and depositing a conductive material in the etched region.

The ground member 120 may be present at some locations of the semiconductor chip 110, and may be formed to have a shape of a number sign (or alternatively, referred to as a hash tag or a pound sign) (#) to connect front, rear, left, and right portions of the side surface of the semiconductor chip 110. In a case where the ground member 120 is formed in the shape of the number sign (#) on the front, rear, left, and right portions of the side surface of the semiconductor chip 110, an electromagnetic wave, which may be emitted from the side surface of the semiconductor chip 110, may be shielded together with an electromagnetic shielding member in a completely surrounded manner (see 130 in FIG. 11).

The semiconductor chip 110 may include an active surface 110A and a non-active surface 110B. A semiconductor device may be provided on the active surface 110A of the semiconductor chip 110, and the ground member 120 also may be provided on the active surface 110A of the semiconductor chip 110. The ground member 120 may be exposed to the outside. The non-active surface 110B of the semiconductor chip 110 may be a surface opposite to the active surface 110A of the semiconductor chip 110. The electromagnetic shielding member (see 130 of FIG. 11) may be formed on the non-active surface 110B of the semiconductor chip 110A in a subsequent process.

Figure 9:
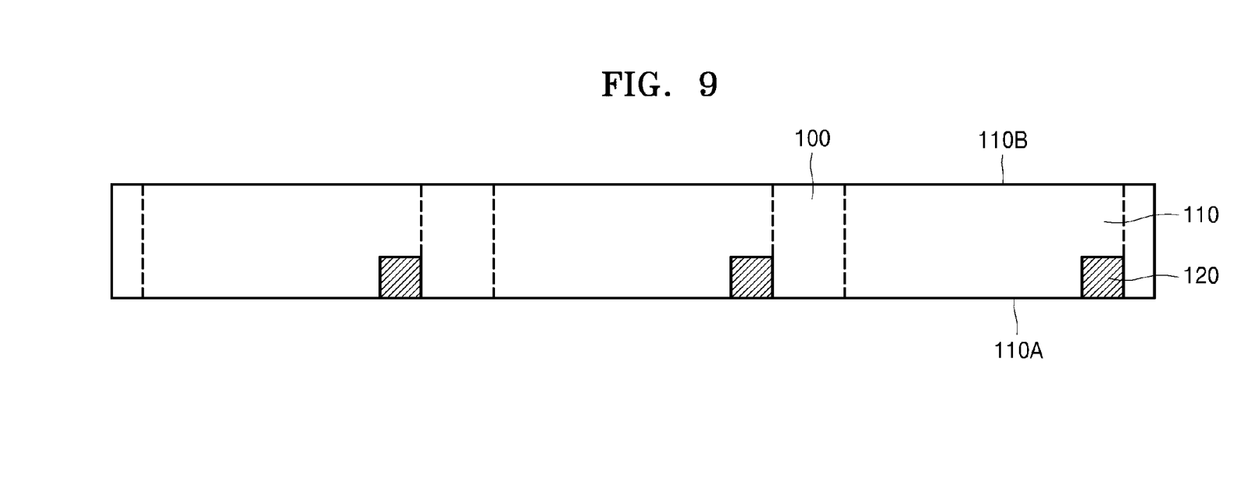

FIG. 9 illustrates the semiconductor wafer 100 on which a back grinding process is performed.

Although not illustrated, a protection tape for a back grinding process may be attached to a surface of the semiconductor wafer 100 on which the semiconductor device is formed. The protection tape may protect the surface of the semiconductor wafer 100 during a back grinding process. The protection tape may use a tape that is sufficiently transparent to see a circuit pattern of the semiconductor wafer 100 or a surface shape of the semiconductor wafer 100.

The semiconductor wafer 100, on which the protection tape for the back grinding process is attached, may be turned over, and another surface of the semiconductor wafer 100 on which protection tape is not attached may be ground to an arbitrary thickness by using a grinding tool. A thickness of the semiconductor wafer 100 before grinding may be about 700 µm and a thickness of the semiconductor wafer 100 after grinding may be about 15 µm.

Figure 10:
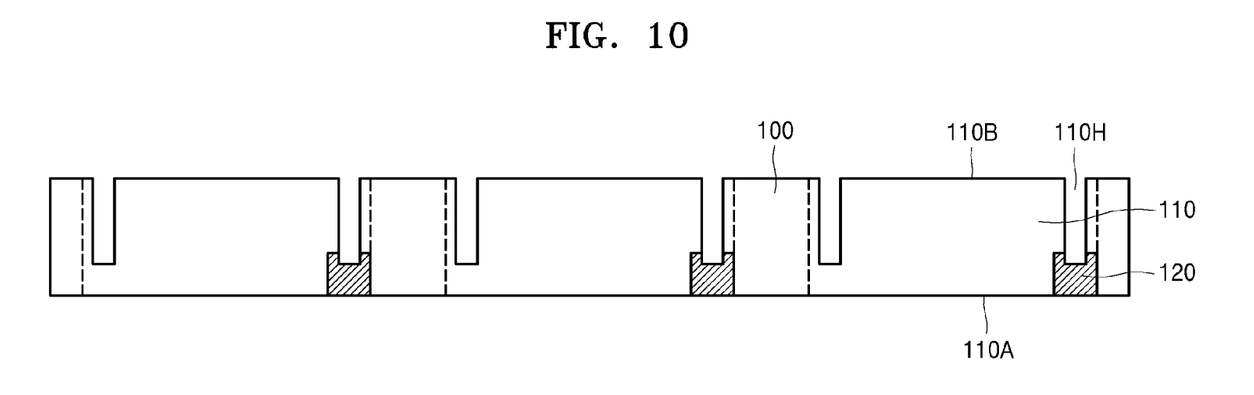

FIG. 10 illustrates a trench 110H formed in the semiconductor wafer 100 and exposing the ground member 120.

A depth of the trench 110H may be a depth at which a top surface of the ground member 120 is exposed. The trench 110H may be formed in the semiconductor chip 110 and have a shape of a number sign or alternatively, referred to as a hash tag or a pound sign) (#) when viewed from above. According to some example embodiments, a plurality of trenches 110H may be formed and each of the plurality of trenches may have a pillar shape in the semiconductor chip 110.

The trench 110H may be formed using a device capable of forming a depth in the order of several micro-meters, for example, a dicing saw or a laser diode.

The trench 110H may also be referred to as a penetration portion that passes through the semiconductor wafer 100. As illustrated in FIG. 10, the trench 110H may be formed to expose the ground member 120 on the active surface 110A of the semiconductor chip 110.

The trenches 110H may be formed at a location that exposes the ground member 120 as well as at a location that does not expose the ground member 120. According to the example embodiment, the ground member 120 may be present at select regions of the semiconductor chip 110. Thus, some of the trenches 110H may not expose the ground members 120 at their bottom surfaces.

Figure 11:
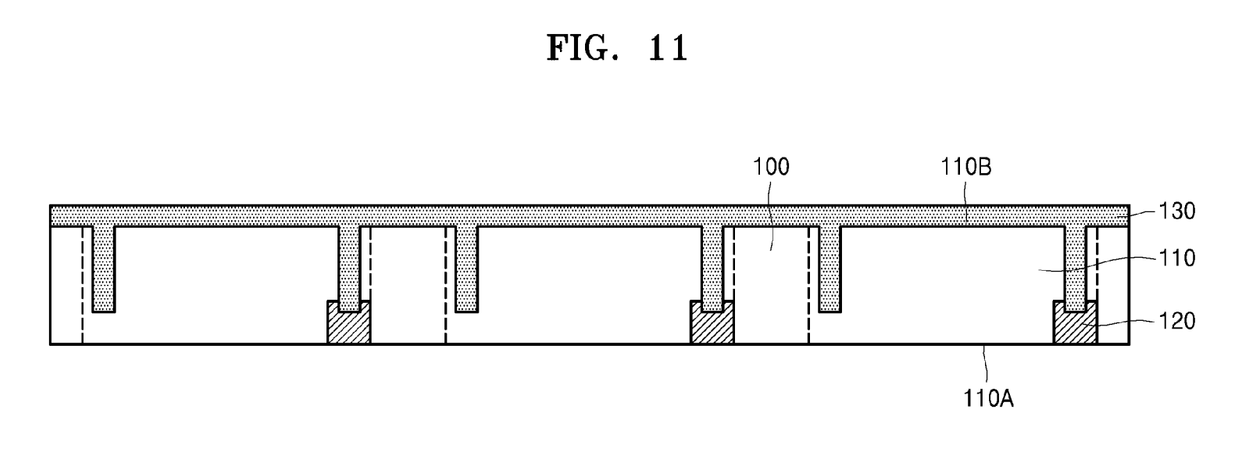

FIG. 11 illustrates an electromagnetic shielding member 130 formed in the trench 110H, which is formed in the semiconductor wafer 100.

The electromagnetic shielding member 130 may fill the trenches 110H formed in the semiconductor wafer 100 and cover at least some regions of the non-active surface 110B of the semiconductor chip 110. The electromagnetic shielding member 130 may be formed to contact the ground members 120 exposed by the trenches 110H and fill all regions of the trenches 110H or some regions of the trenches 110H, for example, only inner wall surfaces of the trenches 110H.

Further, the electromagnetic shielding member 130 may cover at least some regions of the non-active surface 110B of the semiconductor chip 110. In order to perform the electromagnetic shielding function of the electromagnetic shielding member 130, the non-active surface 110B of the semiconductor chip 110 may be covered as widely as possible. For example, the electromagnetic shielding member 130 may cover the entire non-active surface 110B of the semiconductor chip 110.

The electromagnetic shielding member 130 may be made of a metal, for example, a conductive material (e.g., copper or silver). The electromagnetic shielding member 130 may be made of a metal thin film. The metal thin film may be formed using a thin film deposition method, for example, a spray coating process, an electroplating process, an electroless plating process, or a sputtering process.

The electromagnetic shielding member 130 formed in the trench 110H may be referred to as a first electromagnetic shielding member, and the electromagnetic shielding member 130 formed in the non-active surface of the semiconductor chip 110 may be referred to as a second electromagnetic shielding member. The first electromagnetic shielding member and the second electromagnetic shielding member may be made of the same material or different materials. For example, after the first electromagnetic shielding member is formed, the second electromagnetic shielding member may be formed.

In order to completely fill the trench 110H having a relatively large aspect ratio, the first electromagnetic shielding member may be formed first, and subsequently, the second electromagnetic shielding member may be formed using a material suitable to cover a wide area.

Figure 12:
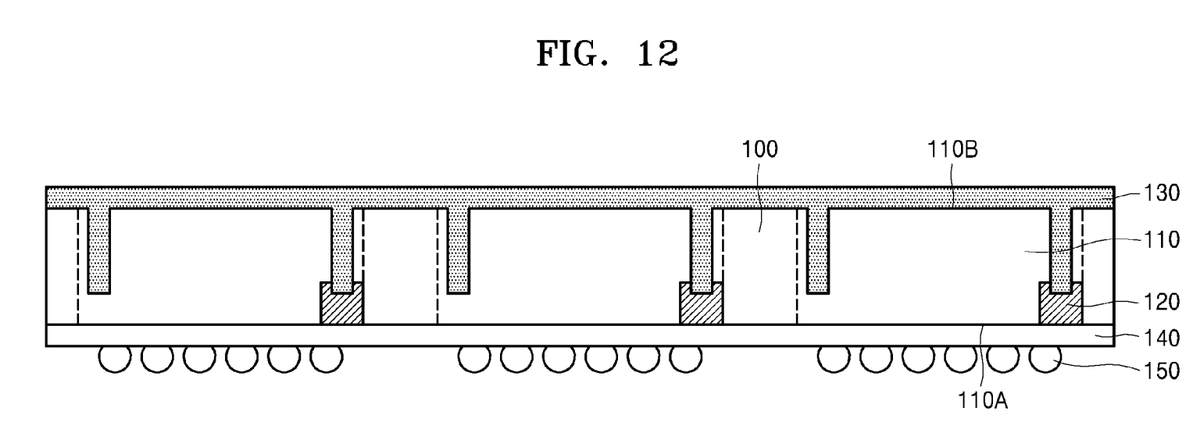

Referring to FIG. 12, a redistribution layer 140 may be formed on the active surface 110A of the semiconductor chip 110.

A wiring existing in the redistribution layer 140 may electrically connect components provided on the active surface 110A of the semiconductor chip 110 to the outside. The wiring may be provided in the redistribution layer 140. The redistribution layer 140 may include a wiring and an insulating film. According to some example embodiments, the redistribution layer 140 may be directly formed on the semiconductor wafer 100.

A connection member 150 may be electrically connected to the wiring of the redistribution layer 140. The connection member 150 may transfer an electric signal when the semiconductor chip 110 is attached to a package substrate, for example, a PCB, a ceramic substrate, a glass substrate, or an interposer substrate.

The connection member 150 may be made of a solder ball. A plurality of connection members 150 may be formed on the active surface 110A of the semiconductor chip 110, and pads may be respectively disposed on the connection members 150. The connection member 150 may include only a copper pillar, or may include a combination of a copper pillar and a solder.

Figure 13:
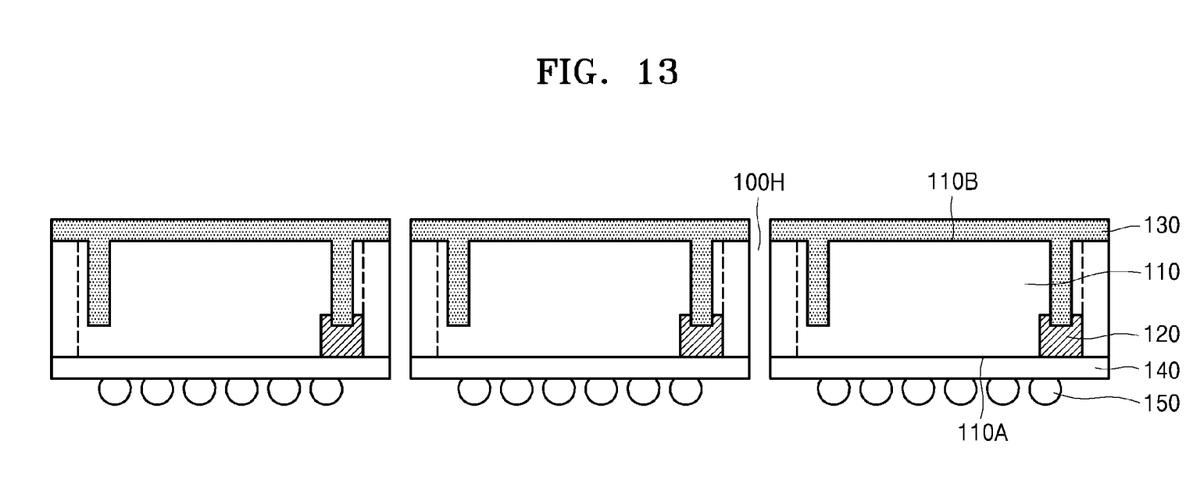

FIG. 13 illustrates semiconductor packages formed by performing dicing on the semiconductor wafer 100 along scribe lines.

The plurality of semiconductor chips 110 may be provided on the semiconductor wafer 100, and scribe lines may be provided between the semiconductor chips 110. The individual semiconductor packages may be completed by performing dicing the semiconductor wafer 100 along the scribe lines.

According to some example embodiments, the process of forming electromagnetic shielding layers may be performed after dicing the semiconductor chips 110. However, in this example embodiment, the process of forming the electromagnetic shielding member 130 may be performed before dicing the semiconductor chip 110. Thus, a manufacturing process may be simplified and a manufacturing cost may be reduced.

Figure 14:
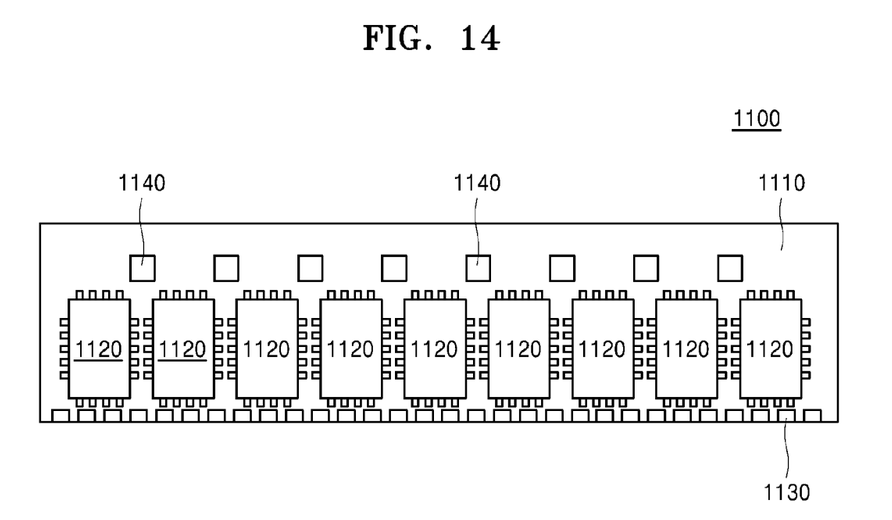
FIG. 14 is a plan view of a memory module including a semiconductor package, according to an example embodiment.

FIG. 14 is a plan view of a memory module 1100 including semiconductor packages 1120, according to an example embodiment.

Referring to FIG. 14, the memory module 1100 may include a module substrate 1110 and a plurality of semiconductor packages 1120 attached to the module substrate 1110.

The semiconductor package 1120 may include a semiconductor package according to an example embodiment. For example, the semiconductor package 1120 may include the semiconductor package described above with reference to FIGS. 1 to 3.

Connection portions 1130, which are configured to be inserted into or coupled with a main board, may be disposed at one side of the module substrate 1110. Ceramic decoupling capacitors 1140 may be disposed on the module substrate 1110. The memory module 1100 according to an example embodiment is not limited to the configuration of FIG. 14, and may be manufactured in various types.

Figure 15:
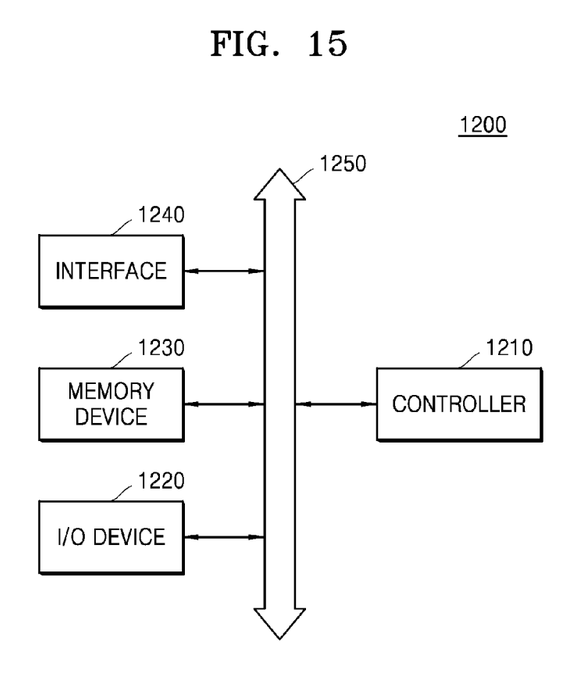
FIG. 15 is a configuration diagram of a system including a semiconductor package, according to an example embodiment.

FIG. 15 is a configuration diagram of a system 1200 including a semiconductor package, according to an example embodiment.

Referring to FIG. 15, the system 1200 may include a controller 1210, an input/output device 1220, a memory device 1230, and an interface 1240. The system 1200 may be a mobile system or an information transmitting/receiving system. In some exemplary embodiments, examples of the mobile system may include a personal digital assistant (PDA), a portable computer, a web tablet, a wireless phone, a mobile phone, a digital music player, and a memory card. The controller 1210 may be configured to control an execution program on the system 1200 and may be, for example, a microprocessor, a digital processor, a microcontroller, or other similar devices. The input/output device 1220 may be used to input or output data of the system 1200. The system 1200 may be connected to an external device, for example, a personal computer or a network, through the input/output device 1220 and exchange data with the external device. Examples of the input/output device 1220 may include, for example, a keypad, a keyboard, or a display.

The memory device 1230 may store codes and/or data for operations of the controller 1210, or may store data processed by the controller 1210. The memory device 1230 may include a semiconductor package according to an example embodiment. For example, the memory device 1230 may include the semiconductor package described above with reference to FIGS. 1 to 3.

The interface 1240 may be a data transmission path between the system 1200 and an external device. The controller 1210, the input/output device 1220, the memory device 1230, and the interface 1240 may communicate with one another through a bus 1250. The system 1200 may be used in, for example, a mobile phone, an MP3 player, a navigation device, a portable multimedia player (PMP), a solid state disk (SSD), or home appliances.

Figure 16:
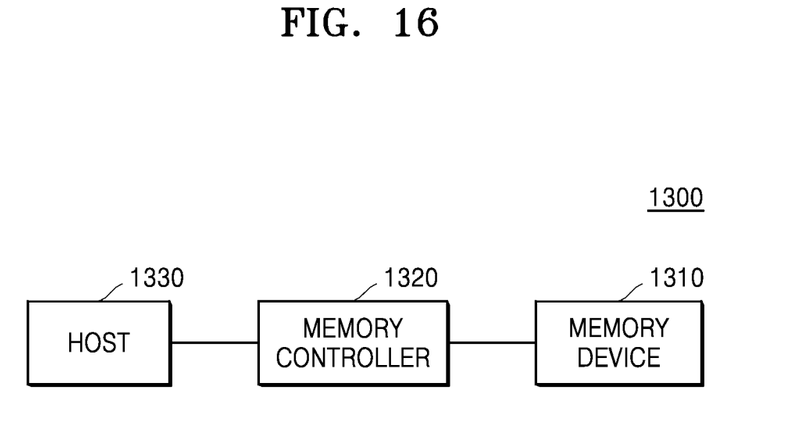
FIG. 16 is a configuration diagram of a memory card including a semiconductor package, according to an example embodiment.

FIG. 16 is a configuration diagram of a memory card 1300 including a semiconductor package, according to an example embodiment.

Referring to FIG. 16, the memory card 1300 may include a memory device 1310 and a memory controller 1320.

The memory device 1310 may store data. In some example embodiments, the memory device 1310 may have a non-volatile characteristic that can retain stored data even when power is interrupted. The memory device 1310 may include the semiconductor package according to an example embodiment. For example, the memory device 1310 may include the semiconductor package described above with reference to FIGS. 1 to 3.

The memory controller 1320 may read data from the memory device 1310 in response to a read/write request from a host 1330, or may store data in the memory device 1310.

While the inventive concepts have been particularly shown and described with reference to some example embodiments thereof, it will be understood that various changes in form and details may be made therein without departing from the spirit and scope of the following claims.

What is claimed is:

1. A semiconductor package comprising:
a semiconductor chip having an active surface and a non-active surface opposite to the active surface;
a ground member on the active surface of the semiconductor chip, the ground member including a recessed surface; and
an electromagnetic shielding member penetrating through the semiconductor chip and electrically connected to the ground member, the electromagnetic shielding member covering at least some regions of the non-active surface of the semiconductor chip, the electromagnetic shielding member engaged with the ground member such that at least a portion of the electromagnetic shielding member is in contact with the recessed surface.

2. The semiconductor package of claim 1, wherein portions of the electromagnetic shielding member penetrating through the semiconductor chip are connected together to have a shape in a form of a number sign (#) in the semiconductor chip.

3. The semiconductor package of claim 1, wherein portions of the electromagnetic shielding member in the semiconductor chip have a pillar shape.

4. The semiconductor package of claim 1, wherein the electromagnetic shielding member entirely covers the non-active surface of the semiconductor chip.

5. The semiconductor package of claim 1, wherein a side surface of the semiconductor chip is exposed to an outside.

6. The semiconductor package of claim 1, wherein the ground member is exposed through the non-active surface and connected to the electromagnetic shielding member.

7. The semiconductor package of claim 1, further comprising:
a redistribution layer on the active surface of the semiconductor chip; and
a connection member electrically connected to the redistribution layer.

8. The semiconductor package of claim 1, further comprising:
a molding member covering the electromagnetic shielding member and a side surface of the semiconductor chip.

9. The semiconductor package of claim 8, further comprising:
a redistribution layer on a surface of the molding member, through which the active surface of the semiconductor chip is exposed; and
a connection member electrically connected to the redistribution layer.

10. The semiconductor package of claim 9, wherein the connection member includes a solder ball.

11. A semiconductor package comprising:
a semiconductor chip having an active surface and a non-active surface opposite to the active surface;
a ground member spaced apart from an edge of the active surface of the semiconductor chip, the ground member including a recessed surface;
the semiconductor chip further having a penetration hole penetrating therethrough, the penetration hole exposing the ground member;
a first electromagnetic shielding member filling at least some portion of the penetration hole and electrically connected to the ground member, the first electromagnetic shielding member engaged with the around member such that at least a portion of the first electromagnetic shielding member is in contact with the recessed surface; and
a second electromagnetic shielding member connected to the first electromagnetic shielding member and covering at least some portion of the non-active surface of the semiconductor chip.

12. The semiconductor package of claim 11, wherein the second electromagnetic shielding member entirely covers the non-active surface of the semiconductor chip.

13. The semiconductor package of claim 11, wherein the first electromagnetic shielding member is spaced apart from a side surface of the semiconductor chip.

14. The semiconductor package of claim 11, wherein the first electromagnetic shielding member has a shape in a form of a number sign (#) in the semiconductor chip.

15. The semiconductor package of claim 11, wherein the first electromagnetic shielding member includes a plurality of pillar shape structures in the semiconductor chip.

16. A semiconductor package comprising:
a semiconductor chip having an active surface and a non-active surface opposite to the active surface;
at least one ground member on the active surface, the at least one ground member including a recessed surface; and
an electromagnetic shielding structure connected to the at least one ground member such that at least a portion of the electromagnetic shielding structure is in contact with the recessed surface, the electromagnetic shielding structure including a plurality of pillar shape electromagnetic shielding members, the plurality of pillar shape electromagnetic shielding members penetrating through the semiconductor chip while being proximate to a side surface of the semiconductor chip.

17. The semiconductor package of claim 16, wherein in a top view, the electromagnetic shielding structure has a shape in a form of a number sign (#), the number sign connecting the plurality of pillar shape electromagnetic shielding members together.

18. The semiconductor package of claim 16, wherein the electromagnetic shielding structure further includes a member, the member covering at least some portion of the non-active surface of the semiconductor chip and connected to some of the plurality of pillar shape electromagnetic shielding members.

19. The semiconductor package of claim 16, wherein the at least one ground member receives one or more of the plurality of pillar shape electromagnetic shielding members.

* * * * *